(12) United States Patent
Hsieh et al.

(10) Patent No.: US 10,563,019 B2
(45) Date of Patent: Feb. 18, 2020

(54) STRUCTURE OF PHOSPHOROUS-CONTAINING FUNCTIONALIZED POLY(ARYLENE ETHER) AND COMPOSITIONS PREPARED THEREFROM

(71) Applicant: Jiangsu Yoke Technology Co., Ltd, Jiangsu Province (CN)

(72) Inventors: Tung-Ying Hsieh, Jiangsu Province (CN); Qi Shen, Jiangsu Province (CN); Jun Chen, Jiangsu Province (CN)

(73) Assignee: Jiangsu Yoke Technology Co., Ltd, Jiangsu Province (CN)

( * ) Notice: Subject to any disclaimer, the term of this patent is extended or adjusted under 35 U.S.C. 154(b) by 651 days.

(21) Appl. No.: 14/931,863

(22) Filed: Nov. 4, 2015

(65) Prior Publication Data

US 2016/0130406 A1 May 12, 2016

(30) Foreign Application Priority Data

Nov. 6, 2014 (CN) .......................... 2014 1 0623786

(51) Int. Cl.
| | | |
|---|---|---|
| *C08G 79/04* | (2006.01) | |
| *C08K 3/36* | (2006.01) | |
| *C08K 5/5435* | (2006.01) | |
| *B23B 5/26* | (2006.01) | |
| *B32B 5/02* | (2006.01) | |
| *B32B 15/20* | (2006.01) | |
| *B32B 5/22* | (2006.01) | |
| *B32B 15/14* | (2006.01) | |
| *H05K 1/03* | (2006.01) | |
| *B32B 5/26* | (2006.01) | |

(52) U.S. Cl.
CPC ............ *C08G 79/04* (2013.01); *B32B 5/02* (2013.01); *B32B 5/022* (2013.01); *B32B 5/22* (2013.01); *B32B 5/26* (2013.01); *B32B 15/20* (2013.01); *C08K 3/36* (2013.01); *C08K 5/5435* (2013.01); *B32B 15/14* (2013.01); *B32B 2260/023* (2013.01); *B32B 2260/046* (2013.01); *B32B 2262/0269* (2013.01); *B32B 2262/101* (2013.01); *B32B 2264/10* (2013.01); *B32B 2307/204* (2013.01); *B32B 2307/306* (2013.01); *B32B 2307/3065* (2013.01); *B32B 2307/538* (2013.01); *B32B 2457/08* (2013.01); *H05K 1/0366* (2013.01); *H05K 1/0373* (2013.01); *H05K 2201/029* (2013.01)

(58) Field of Classification Search
CPC ........ C08G 79/04; C08K 3/36; C08K 5/5435; B32B 5/26; B32B 15/14; B32B 2260/023; B32B 2260/046; B32B 2262/0269; B32B 2262/101; B32B 2307/204; B32B 2307/306; B32B 2307/3065; B32B 2457/08; H05K 1/0366

See application file for complete search history.

(56) References Cited

U.S. PATENT DOCUMENTS

| | | | | |
|---|---|---|---|---|
| 4,287,321 A | * | 9/1981 | Olander | ................ C08F 283/08 |
| | | | | 525/392 |
| 5,071,922 A | | 12/1991 | Nelissen et al. | |
| 6,352,752 B1 | | 3/2002 | Nakajima et al. | |
| 6,627,704 B2 | | 9/2003 | Yeager et al. | |
| 2001/0053820 A1 | * | 12/2001 | Yeager | ................ C08G 65/485 |
| | | | | 525/186 |
| 2004/0198863 A1 | * | 10/2004 | Ishii | .................... C08F 290/062 |
| | | | | 522/162 |
| 2012/0289663 A1 | * | 11/2012 | Mullins | ............. C07F 9/657172 |
| | | | | 525/420 |

FOREIGN PATENT DOCUMENTS

| | | |
|---|---|---|
| CN | 101044187 A | 9/2007 |
| CN | 101305030 A | 11/2008 |
| CN | 101589109 A | 11/2009 |
| CN | 101796132 A | 8/2010 |
| CN | 101885812 A | 11/2010 |
| CN | 102775445 A | 11/2012 |
| CN | 102807658 A | 12/2012 |
| CN | 103382242 A | 11/2013 |
| CN | 103709717 A | 4/2014 |
| CN | 103724575 A | 4/2014 |
| DE | 4308184 A1 | 9/1994 |
| DE | 4308185 A1 | 9/1994 |
| DE | 4308187 A1 | 9/1994 |
| EP | 0384939 A1 | 9/1990 |
| EP | 0384940 A1 | 9/1990 |
| EP | 0408990 A2 | 1/1991 |
| WO | 9607685 A1 | 3/1996 |
| WO | 9607686 A1 | 3/1996 |
| WO | 2013187185 A1 | 12/2013 |

* cited by examiner

*Primary Examiner* — Shane Fang
(74) *Attorney, Agent, or Firm* — CKC & Partners Co., LLC

(57) ABSTRACT

A structure of phosphorous-containing functionalized poly (arylene ether), a preparation method thereof, and a composition prepared therefrom are provided. The curable (cross-linkable) composition includes an unsaturated monomer and a phosphorous-containing functionalized poly (arylene ether) having a polymerizable group and a molecular weight between 500 and 20,000. The composition provides excellent fluidity and fast curing rate. After curing, the composition exhibits excellent low dielectric coefficient and dielectric loss, high heat resistance and flame retardancy. It is suitable for prepregs, laminated sheets for printed circuits or the like.

5 Claims, No Drawings

STRUCTURE OF PHOSPHOROUS-CONTAINING FUNCTIONALIZED POLY(ARYLENE ETHER) AND COMPOSITIONS PREPARED THEREFROM

RELATED APPLICATIONS

This application claims priority to China Application Serial Number 201410623786.2, filed Nov. 6, 2014 which is herein incorporated by reference.

BACKGROUND

Technical Field

The disclosure relates to a technical field of novel compounds relating to a structure and preparation method of a phosphorous-containing functionalized poly(arylene ether). The disclosure also relates to using the compound reacting with a compound having unsaturated double bonds to prepare a thermosetting composition which is friendly to environment and has excellent properties. The composition provides good fluidity and fast curing (i.e. cross-linking) rate. After curing, the composition presents excellent low dielectric constant and dielectric loss, high heat resistance and flame retardancy, and thus is suitable for prepregs, laminated sheets in printed circuits.

Description of Related Art

Currently, the electrical and electronic industry is rapidly developed. The developing direction of electronic devices is lightweight, high performance, high reliability, and environmental protection. The specific requirements of laminated sheets for printed circuits is expressed by high heat resistance, low thermal expansion coefficient, high resistance to heat and humid, environmentally friendly and flame retardancy, low dielectric constant and dielectric loss, and high elastic modulus. Therefore, the traditional epoxy resin has been unable to fully meet development needs of the printed circuit laminated sheets, and the applications of the poly(arylene ether) having high resistance, low dielectric constant and dielectric loss, as well as excellent toughness is more and more outstanding.

Traditional poly(arylene ether) resins are thermoplastic materials with a high molecular weight. The high viscous flow temperature, high melting viscosity, and poor solubility make the processability of the traditional poly(arylene ether) still not enough. In the application of laminated sheets for printed circuits, the high molecular-weight poly(arylene ether) is low-molecularly modified and used with a thermosetting resin. For example in patent CN101796132A, the poly(arylene ether) with a number average molecular weight below 5,000 and a cyanate are used in combination. The copper clad laminates made from this resin composition, relative to a pure is cyanate system, have a lower dielectric constant and dielectric loss, a better heat resistance, and a low water absorption rate. However, the active groups of the low molecular weight polyphenylene ether resin, in patent CN101796132A, has a small number and low activity, and almost does not participate the cross-linking reaction of cyanates. The cured product only can compose a semi-interpenetrating network (semi-IPN). The polyphenylene ether resin in the semi-IPN also cannot cross-link itself, and can only intersperse in the cross-linked network in a free state. Moreover, the compatibility of the poly(arylene ether) and other thermosetting resins is poor, and thus the resin phases are separated. The sheets made from the resin composition usually have defects of higher heat expansion coefficient and poorer heat stability, which are difficult to be solved.

For the low reactivity problem of polyphenylene, some further modified the low-molecular poly(arylene ether) with active groups, especially functional groups of unsaturated double bonds. For example, U.S. Pat. No. 5,071,922 of Nelissen, as well as U.S. Pat. Nos. 6,352,752 and 6,627,704 of Yager describes that may be widely applied in the thermosetting resin field. In CN102807658, the olefin resins containing butadiene with a greater molecular weight was used as a cross-linking agent, and used with components of functionalized polyphenylene ether resins and initiators to obtain a resin composition used in laminated sheets for printed circuits. The composition has very good dielectric properties and heat resistance, and is suitably used in high-frequency electronic circuit boards. However, the laminated sheets prepared for printed circuit boards have a problem of insufficient flame retardancy and a requirement of adding halogen flame retardants. However, the halogen flame retardants will produce dioxin, benzofuran, as well as irritant and corrosive gases when burning. Moreover, small molecular flame retardants often cause the decreased mechanical properties to deteriorate the material. Migration and volatile problems existing at the same time results in reduced performance and non-ideal flame retardant effect. Therefore, in the thermosetting resin composition, inventions of replacing the halogen flame retardants by organic phosphorous flame retardants emerge continuously, such as described in patents EP A 0384939, EP A 0384940, EP A 0408990, DE A 4308184 DE A 4308185, DE A 4308187, WO A 96/07685, and WO A 96/07686. In addition, for the laminated sheets in printed circuits, the current international standards require lead-free processes since the increasing environmental awareness. Therefore, the requirements for the process performance of the substrates are especially strict, especially the glass transition temperature (Tg) and the heat-resistance in a solder pot has become important issues that have to be overcome for persons skilled in the art.

SUMMARY

This invention provides a novel phosphorous-containing functionalized poly(arylene ether), which can be applied to thermosetting and impart high flame-retardant effect. By introducing an environmentally friendly organic phosphorous-based group, in addition to the excellent properties of the original thermosetting composition, the requirement of the high flame-retardant effect, as well as increased glass temperature (Tg) and heat-resistance of the material also can be reached. Therefore, the thermosetting system may be successfully applied in the field of lightweight, thin, small and accurate electronic materials.

In an embodiment, this novel phosphorous-containing functionalized poly(arylene ether) compound is expressed by the chemical structure (I):

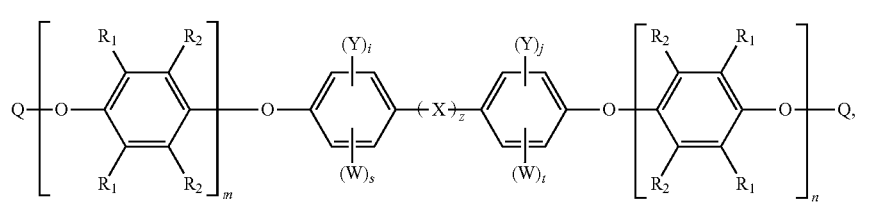

wherein each $R_1$ is independently selected from a C1-C10 alkyl group, a C2-C10 alkenyl group, a C2-C10 alkynyl group, a C1-C10 hydroxyalkyl group, a phenyl group, and a C1-C10 alkoxyl group; each $R_2$ is independently selected from H, a C1-C10 alkyl group, a C2-C10 alkenyl group, C2-C10 alkynyl group, a C1-C10 hydroxyalkyl group, a phenyl group and a C1-C10 alkoxyl group; i and are integers of 0-2, respectively, and sum of i and j is not equal to 0; m and n are integers of 0-50, and sum of m and n is not smaller than 3; z is 0 or 1; each W is independently selected from H and C1-C5 alkyl group; s and t are integers of 1-4;

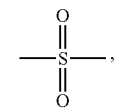

wherein $R_7$ and $R_8$ are independently selected from H, a C1-C10 alkyl group, and a C6-C18 aromatic group.

In another embodiment, the phosphorous-containing functionalized poly(arylene ether) compound has a chemical structure shown below:

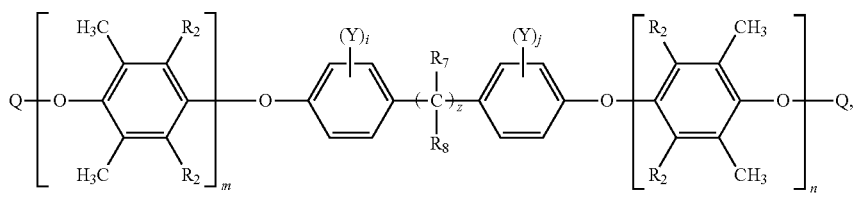

Q is a capping group selected from H,

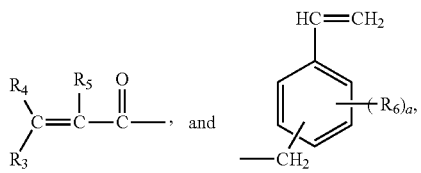

wherein $R_3$, $R_4$ and $R_5$ are independently selected from H, a C1-C10 alkyl group and a C6-C18 aromatic group, $R_6$ is a C1-C10 alkyl group or a C6-C18 aromatic group, and a is an integer of 0-4;
Y has a chemical structure below

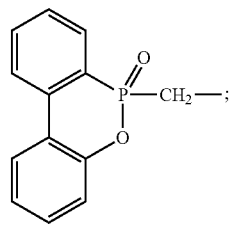

and
X is selected from

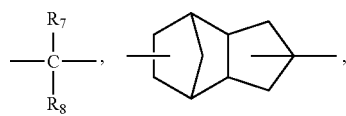

wherein $R_2$ is independently H or methyl group, i and j are integers of 0-2, respectively, and sum of i and j is not equal to 0; m and n are integers of 0-50, and sum of m and n is not smaller than 4; $R_7$ and $R_8$ are independently selected from H, a C1-C10 alkyl group, and a C6-C18 aromatic group; z is 0 or 1;
Q is a capping group selected from H,

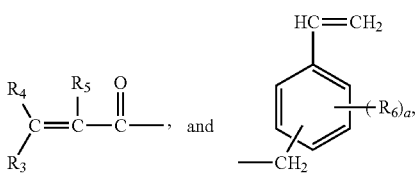

wherein $R_3$, $R_4$ and $R_5$ are independently selected from H, a methyl group and a phenyl group, $R_6$ is a methyl group or a phenyl group, and a is an integer of 0-4; and Y has the chemical structure below:

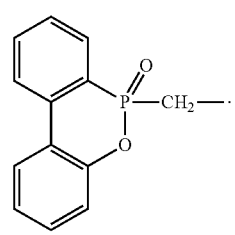 [SMILES: CCP1(=O)Oc2ccccc2-c2ccccc21 ; ";"]

In another embodiment, the phosphorous-containing functionalized poly(arylene ether) compound has a chemical structure shown below:

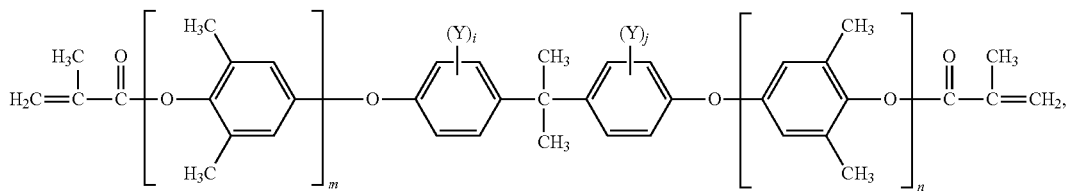

wherein i and j are integers of 0-2, respectively, and the sum of i and j is not equal to 0; m and n are integers of 0-50, and the sum of m and n is not smaller than 4; and Y has the chemical structure below:

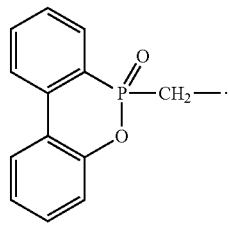

In another embodiment, the phosphorous-containing functionalized poly(arylene ether) compound has a chemical structure shown below:

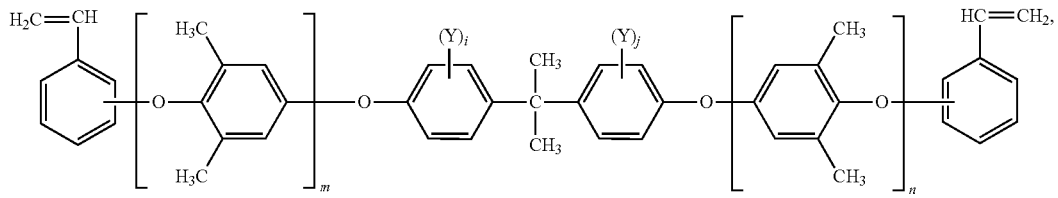

wherein i and j are integers of 0-2, respectively, and sum of i and j is not equal to 0; m and n are integers of 0-50, and sum of m and n is not smaller than 4; and Y is

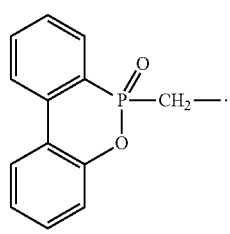 [SMILES: CCP1(=O)Oc2ccccc2-c2ccccc21 ; "."]

As described above, the phosphorous-containing functionalized poly(arylene ether) may be prepared by many synthesis methods. In an embodiment, the preparation method of the phosphorous-containing functionalized poly(arylene ether) comprises: A bisphenol compound and formaldehyde were used to synthesize a phenolic resin. The phenolic resin and DOPO (9,10-Dihydro-9-oxa-10-phosphaphenanthrene-10-oxide) are mixed to perform a condensation reaction to obtain a phosphorous-containing bisphenol compound. A phenol is oxidatively polymerized in the presence of a catalyst and at a condition of suitably forming a corresponding poly(arylene ether). A redistribution reaction is performed to react the poly(arylene ether) and the phosphorus-containing bisphenol compound form a phosphorus-containing poly(arylene ether) having two terminal hydroxyl groups. A capping agent with the phosphorus-containing poly(arylene ether) having two terminal hydroxyl groups are reacted to form the phosphorous-containing functionalized poly(arylene ether).

In another embodiment, a phosphorus-containing functionalized poly(arylene ether) is an oxydtively copolymerized product of a phenol and a phosphorous-containing bisphenol. A suitable phenol usually has a chemical structure below:

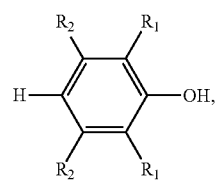

wherein each $R_1$ is independently selected from a primary or second C1-C10 alkyl group, a C2-C10 alkenyl group, C2-C10 alkynyl group, a C1-C10 hyrdoxyalkyl group, a phenyl group, a C1-C10 alkoxyl group; and each $R_2$ is independently selected from H, a primary or secondary C1-C10 alkyl group, a C2-C10 alkenyl group, C2-C10 alkynyl group, a C1-C10 hyrdoxyalkyl group, a phenyl group, a C1-C10 alkoxyl group. In an embodiment, the phenol is 2,6-dimethylphenol, 2,3,6-trimethylphenol, or a mixture thereof.

The suitable phosphorous-containing bisphenol compound usually has a chemical structure.

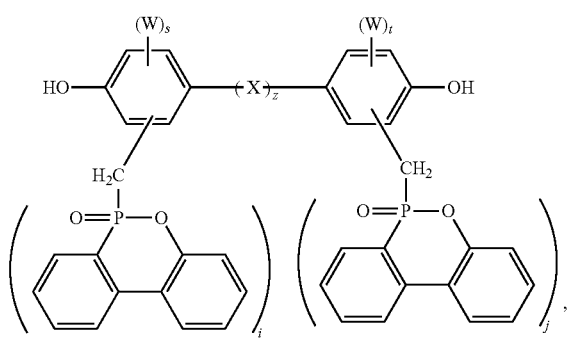

wherein each W is independently selected from H and C1-C5 alkyl group; s and t are integers of 1-4; i and j are integers of 0-2, respectively, and sum of i and j is not equal to 0;

X is selected from

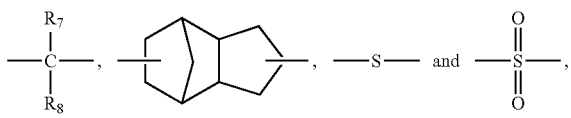

wherein $R_7$ and $R_6$ are independently selected from H, a C1-C10 alkyl group, and a C6-C18 aromatic group.

In the synthesis method of phosphorous-containing bisphenol compound, the bisphenol compound reacts with formaldehyde to synthesize a suitable phenolic resin, and the phenolic resin is then mixed with DOPO (9,10-Dihydro-9-oxa-10-phosphaphenanthrene-10-oxide) to perform condensation reaction. In an embodiment, the especially suitable bisphenol compound may be biphenol, bisphenol A, bisphenol F, p-dihydroxydiphenyl sulfide, bisphenol S, one or two of dicyclopentadiene phenol resin, and a combination thereof.

In an embodiment, the phosphorous-containing functionalized poly(arylene ether) is prepared by reacting the phosphorous-containing (polyarylene ether) having two terminal hydroxyl groups with a capping agent.

The capping agents being capable of reacting with terminal hydroxyl groups of a phosphorous-containing poly (arylene ether) to form capped poly(arylene ether) are known in the art. The useable capping agents may comprises halogenated hydrocarbons (such as acryloyl chloride and methacryloyl chloride), carboxylic anhydrides (such as acrylic anhydride and methacrylic anhydride) etc.

In an embodiment, the conversion of the hydroxyl groups is preferably greater than 95%, more preferably greater than 99%, and even more preferably 100% In experiments, the amounts of the capping agent and the phosphorous-containing poly(arylene ether) material have to be in a proper ratio to satisfy the requirement of fast equilibrium and completely capping (toward a high ratio) and avoid introducing excess reagents (toward a low ratio) to increase impurities in the washing step.

In an embodiment, the number average molecular weight of the phosphorous-containing functionalized poly(arylene ether) is preferably 500 to 20,000, more preferably 500 to 10,000, and even more preferably 800 to smaller than 5,000. The processing properties and cross-linking/curing ability of phosphorous-containing functionalized poly(arylene ether) having a number average molecular weight of greater than 20,000 is poor. Hoverer, the heat resistance and dielectric property of the phosphorous-containing functionalized poly (arylene ether) having a number average molecular weight smaller than 500 cannot reach the ideal properties. In this invention, the number average molecular weight was measured by GPC (gel permeation chromatography) using THF as the solvent, and calculated according to the relation graph between the molecular weight of polystyrene and the elution volume.

This phosphorous-containing functionalized poly(arylene ether) compound has proper reactivity, high glass transition temperature, excellent heat resistance, low water absorption, and good electric property. The compound can be used to react with a compound having unsaturated double bonds to form an environmentally friendly halogen-free flame-retardant cured compound to be used as a package material for integrated circuits and semiconductors.

The instant disclosure provides a curable (cross-linkable) phosphorous-containing functionalized poly(arylene ether) composition. The composition comprises (A) phosphorous-containing functionalized poly(arylene ether), (B) cross-linkable unsaturated monomer, (C) an initiator, and (D) a filler. The described composition preferably comprises a phosphorous-containing functionalized poly(arylene ether) compound having a content of about 5-95% (w/t) and a cross-linkable unsaturated monomer having a content of about 95-5% (w/t). The described percentage is based on the total amount of the phosphorous-containing functionalized poly(arylene ether) compound and the cross-linkable unsaturated monomer to be 100 parts by weight. In that range, the content of the phosphorous-containing functionalized poly(arylene ether) compound is preferably greater than 10% (w/t), more preferably greater than 20% (w/t), and even more preferably greater than 50% (w/t).

The cross-linkable unsaturated monomer comprises one or more vinyl resin having a polar functional group, and a molecular weight thereof is smaller than 10,000. Therefore, each molecule of the described unsaturated monomer has more than one carbon-carbon double bonds on average. The typical examples of these unsaturated monomers comprise a polymer containing monomers of butadiene or isoprene, and a modified resin thereof. The resin comprises a maleic anhydride-modified polybutadiene resin, an amine-modified polybutadiene resin, a terminal carboxyl group-modified polybutadiene resin, a terminal hydroxyl group-modified polybutadiene resin, a maleic anhydride-modified copolymers of butadiene and styrene, an acrylate-modified copolymers of butadiene and styrene, a maleic anhydride-modified polyisoprene resin, an amine-modified polyisoprene, a terminal carboxyl group-modified polyisoprene resin, a terminal hydroxyl group-modified polyisoprene resin, a maleic anhydride-modified copolymers of isoprene and styrene, an acrylate-modified copolymer of isoprene and styrene, and a combination thereof. The butadiene and isoprene resin may be liquid or solid at room temperature. The molecular weight of the liquid polybutadiene and polyisoprene may be greater than 5,000, but the molecular weight of these resins is preferably less than 5,000, and more preferably between 1,000 and 3,000.

The viscosity of the liquid resin (at room temperature) in the preferred composition described above is kept at an easily handling level during the processing. For the application of printed circuit boards, in order to obtain a maximum cross-linking density during the curing process, the content of the 1,2-adduct product of polybutadiene and polyisoprene resin is preferably at least 85 wt % This is because that it has a lot of side vinyl groups used in cross-linking. The printed circuit boards must have ultra-high temperature characteristics and thus require a high cross-linking density. The preferred resin has more than 90 wt % 1,2-adduct product of low molecular weight polybutadiene and polyisoprene liquid resin. For the applications irrelevant to printed circuit boards, the product having lower content of 1,2-adduct product may be used.

The described initiator is used in the unsaturated portions of the thermosetting material to induce any compounds being capable of generating free radicals at high temperature. These initiators include peroxide and non-peroxide initiators. The peroxide initiator is selected from one or more of dicumyl peroxide, t-butyl perbenzoate, 2,5-dimethyl-2,5-di(t-butylperoxy) hex-3-yn, di(t-butyl) peroxide, t-butyl cumyl peroxide, di(t-butylperoxy-m-isopropyl)benzene, 2,5-dimethyl-2,5-di(t-butylperoxy)hexane, di(t-butylperoxy) isophthalic acid, 2,2-di(t-butylperoxy)butane, 2,2-di(t-butylperoxy)° C.tane, (benzylphthalidyl peroxy)hexane, di(trimethylsilyl) peroxide. Usually, the non-peroxide initiator is selected from one or more of 2,3-dimethyl-2,3-diphenylbutane, and 2,3-trimethylsilyloxy-2,3,diophenylbutane.

The recipe described above also can be cured by radiation technology. It will include the catalysts described above or those used in electron beam curing technology. Typical examples are electron beam and UV radiation.

The examples of the filler include one or more of crystalline silica, fused silica, spherical silica, hollow silica, glass powder, aluminum nitride, boron nitride, silicon carbide, aluminum hydroxide, titanium dioxide, strontium titanate, barium titanate, aluminum oxide, barium sulfate, talc, calcium silicate, calcium carbonate, and mica. These inorganic filler may be non-treated or surface-treated by a silane coupling agent or a titanate coupling agent to be directly added into the thermosetting resin. The fillers described above may be used in a form of grains or fiber.

The organic filler may be used to modify the composition. The organic fillers used in modification include one or more of polytetrafluoroethylene powder, polyphenylene sulfide, polyether imide phthalate, polyphenylene ether and polyethersulfon.

The useable reinforcing component known by persons skilled in the art comprises, but not limited thereto, inorganic or organic material, such as E-, NE-, S-, T- and D-type glass or nonwoven glass fabric and quartz etc. The reinforcing component may be glass roving cloth, glass cloth, broken glass, hollow glass fibers, glass mat, the felt mat of the glass surface and nonwoven glass fabric, ceramic fabric and metal fabric. Especially valuable is the glass having a very low dielectric dissipation factor, which is less than about 0.0015 measured at 1 MHz, more advantageously less than 0.0010, preferably less than 0.0007. The glass having a proper dielectric dissipation factor is usually composed of $Al_2O_3$, $SiO_2$, CaO, $B_2O_3$, MgO and trace amount (usually less than 2 parts by weight) of other oxides. The weight ratio of $Al_2O_3$, $SiO_2$, CaO, $B_2O_3$, MgO and traced amount of other oxides may be changed in a wider range known by the persons skilled in the art to produce a glass having a proper dielectric dissipation factor. The preferred glass is E-, NE-, D-, and S-type glass.

The coupling agent introduced into the reinforcing material is known in the art to increase the adhesion force between the fibrous reinforcing component and the cross-linkable resin composition. Through the introduction, the coupling agent may be considered to be a part of the cross-linkable resin composition. According to the purpose of this invention, the representative coupling agent comprises silane-, titanate-, zirconate-, aluminum- and aluminum zirconium-based coupling agent and other coupling agents known by persons skilled in the art.

The composition may be cured (cross-linked) to a certain degree through many technologies known by persons skilled in the art. These technologies include heating, exposing to light or electron beam. When heat-curing is used, the temperature may be in a range of 80-300° C., and preferably 120-240° C. The heating cycle may be as short as about 1 minute to as long as about 10 hours. The heating cycle in a range of about 1 minute to 6 hours is more favorable, and a preferred range is about 3 to about 5 hours. The cross-linking reaction may be performed in stages to produce partially cross-linked and usually non-sticky resin. Next, the composition is heated through longer cycles or in the temperature range described above to cross link (cure) the composition.

The described fillers that may exist in the composition are listed below. The particulate filler is talc, clay, mica, silica, alumina and calcium carbonate, for example. In addition, the fillers may comprise normal flame retardant additives, such as phosphorous compound. The flame retardant may be halogen-free retardants. The halogen-free flame retardants may be one or more of phosphorous-containing flame retardants, nitrogen-containing flame retardants and silicon-containing flame retardants. The fillers also comprise plasticizers and/or flow promoters and fabric wettability enhancers (such as wetting agents and coupling agents). In some conditions, even the polar fluid, such as normal butane, butanone, polysiloxane, and tetrahydrofuran, may be beneficial. The fillers also may comprise antioxidants, heat and UV stabilizers, lubricants, antistatic agents, dyes, and pigments. For the purpose of this invention, the described filler material above may be used alone or in combination.

The curable (cross-linkable) composition may be dissolved in an effective amount of inert organic solvent. The typical content of the solute is 30 wt % to 60 wt %. The sameness of the solvent is not important, as long as the solvent may be removed by a proper way, such as evaporation. The preferred solvent is aromatics, especially toluene. The sequence of mixing and dissolving is also not important. However, for avoiding early cross-linking, the catalyst and the curing agent (cross-linker) as well as the phosphorous-containing functionalized poly(arylene ether) and cross-linkable monomer should not contact first at a temperature higher than 60° C.

Unless particularly pointed in this application, all numbers and ratios are expressed in terms of weight, and the units are expressed in metric system.

DETAILED DESCRIPTION

In order to make the description of this disclosure more detailed and complete, the embodiments of this invention are illustratively described below. However, this is not the only form of practicing or using the embodiments of this invention. The disclosed various embodiments may be combined or substituted by each other and one embodiment may be added with other embodiments in a beneficial situation. In the following description, numerous specific details will be described in detail in order to enable the reader to fully understand the following embodiments. However, embodiments of this invention may be practiced without certain specific details.

The detailed reaction conditions of the phosphorus-containing bisphenol compound are described below.

REFERENCE EXAMPLE 1

376 g bisphenol, 210 g formaldehyde aqueous solution (mass concentration is 37%), and 24 g NaOH were put into a reactor and then stirred. The temperature was increased to 50° C. and then kept for 3 hours. Next, the temperature was increased to 85° C. and then kept for 3 hours. Afterwards, 480 g n-butanol was added and then refluxed for 12 hours. The temperature was then decreased to 55-60° C. About 324 g n-butanol was removed by reduced pressure distillation to obtain an intermediate. The intermediate was added with 380 g DOPO (9,10-Dihydro-9-oxa-10-phosphaphenanthrene-10-oxide), and the material temperature was progressively increased from 80° C. to 180° C. in 2 hours. The pressure was decreased at 130° C. to ensure timely discharge the n-butanol. The temperature was kept at 180° C. for 1 hour. The material temperature was decreased to 130° C. About 1000 g toluene was added and then stirred for 0.5 hour. The material was discharged to obtain a DOPO-containing dihydroxyl biphenyl (A1).

REFERENCE EXAMPLE 2

456 g bisphenol A, 210 g formaldehyde aqueous solution (mass concentration is 37%), and 24 g NaOH were put into a reactor and then stirred. The temperature was increased to 50° C. and then kept for 3 hours. Next, the temperature was increased to 65° C. and then kept for 3 hours. Afterwards, 480 g n-butanol was added and then refluxed for 12 hours. The material temperature was then decreased to 55-60° C. About 324 g n-butanol was removed by reduced pressure distillation to obtain an intermediate. The intermediate was added with 380 g DOPO (9,10-Dihydro-9-oxa-10-phosphaphenanthrene-10-oxide), and the material temperature was progressively increased from 80° C. to 175° C. in 2 hours. The pressure was decreased at 120° C. to ensure timely discharge the n-butanol. The temperature was kept at 175° C. for 2 hour. The material temperature was decreased to 130° C. About 1000 g toluene was added and then stirred for 0.5 hour. The material was discharged to obtain a DOPO-containing bisphenol A (A2).

REFERENCE EXAMPLE 3

400 g bisphenol F, 210 g formaldehyde aqueous solution (mass concentration is 37%), and 24 g NaOH were put into a reactor and then stirred. The temperature was increased to 50° C. and then kept for 3 hours. Next, the temperature was increased to 65° C. and then kept for 3 hours. Afterwards, 480 g n-butanol was added and then refluxed for 12 hours. The temperature was then decreased to 55-60° C. About 324 g n-butanol was removed by reduced pressure distillation to obtain an intermediate. The intermediate was added with 380 g DOPO (9,10-Dihydro-9-oxa-10-phosphaphenanthrene-10-oxide), and the material temperature was progressively increased from 80° C. to 180° C. in 2 hours. The pressure was decreased at 120° C. to ensure timely discharge the n-butanol. The temperature was kept at 180° C. for 2 hour. The material temperature was decreased to 130° C. About 1000 g toluene was added and then stirred for 0.5 hour. The material was discharged to obtain a DOPO-containing bisphenol F (A3).

REFERENCE EXAMPLE 4

520 g bisphenol S, 210 g formaldehyde aqueous solution (mass concentration is 37%), and 24 g NaOH were put into a reactor and then stirred. The temperature was increased to 50° C. and then kept for 3 hours. Next, the temperature was increased to 85° C. and then kept for 3 hours. Afterwards, 480 g n-butanol was added and then refluxed for 12 hours. The temperature was then decreased to 55-60° C. About 324 g n-butanol was removed by reduced pressure distillation to obtain an intermediate. The intermediate was added with 380 g DOPO (9,10-Dihydro-9-oxa-10-phosphaphenanthene-10-oxide), and the material temperature was progressively increased from 80° C. to 180° C. in 2 hours. The pressure was decreased at 130° C. to ensure timely discharge the n-butanol. The temperature was kept at 180° C. for 1 hour. The material temperature was decreased to 130° C. About 1000 g toluene was added and then stirred for 0.5 hour. The material was discharged to obtain a DOPO-containing bisphenol S (A4).

REFERENCE EXAMPLE 5

664 g dicyclopentadiene phenol resin, 210 g formaldehyde aqueous solution (mass concentration is 37%), and 24 g NaOH were put into a reactor and then stirred. The temperature was increased to 50° C. and then kept for 3 hours. Next, the temperature was increased to 65° C. and then kept for 3 hours. Afterwards, 480 g n-butanol was added and then refluxed for 12 hours. The temperature was then decreased to 55-60° C. About 324 g n-butanol was removed by reduced pressure distillation to obtain an intermediate. The intermediate was added with 1080 g DOPO (9,10-Dihydro-9-oxa-10-phosphaphenanth ene-10-oxide), and the material temperature was progressively increased from 80° C. to 180° C. in 2 hours. The pressure was decreased at 120° C. to ensure timely discharge the n-butanol. The temperature was kept at 180° C. for 2 hour. The material temperature was decreased to 130° C. About 1000 g toluene was added and then stirred for 0.5 hour. The material was discharged to obtain a DOPO-containing dicyclopentadiene phenol resin (A5).

SYNTHETIC EXAMPLE 1

In this reference example, the preparation of poly (2,6-dimethylphenyl ether) is detailed described. In a 5 L 5-necked round bottom flask equipped with a top stirrer, thermometer, and oxygen dip tube, 2.5 g N,N'-di-t-butyl-ethylenediamine (DBEDA), 32 g N,N-dimethyl-butylamine (DBMA), 10 g di-n-butylamine (DBA), 2.8 g methyl trioctyl ammonium chloride, 500 g toluene, and 45 g 50% toluene solution of 2,6-dimethylphenol were added, 8.5 g copper catalyst (a storage solution prepared by adding 14.3 g cuprous oxide to 187.07 g of 48% HBr) was added. Under vigorous stirring, a flow rate of 2 ft$^3$/min oxygen was passed through the solution and a solution of 2,6-dimethylphenol. The mixture was re-stirred for 3 hours, and a water bath was used to keep the temperature below 35° C. 10 ml of glacial acetic acid was used to treat the solution to quench the catalyst. The polymer was separated from the organic phase through methanol precipitation, and the obtained wet cake was dissolved in toluene and re-precipitated in methanol. The separated solid was dried at 70° C. and under vacuum overnight to obtain poly(2,6-dimethylphenyl ether) (A). The obtained poly(2,6-dimethylphenyl ether) containing hydroxyl groups (—OH) was derived through using phosphorous agent, and the content of the terminal hydroxyl group was determined by $^{31}$P NMR to be 0.16%. Weight average molecular weight (Mw) and number average molecular weight (Mn) were measured by gel permeation chromatography using standard polystyrene in THE to be 12531 and 26945 respectively, and the polydispersity index (Mw/Mn) was 2.15.

Synthetic examples 2-6 describe the preparation of phosphorus-containing dihydroxylated poly(arylene ether) in the presence of phosphorous-containing bisphenol compound to redistribute poly (2,6-dimethylphenyl ether).

SYNTHETIC EXAMPLE 2

In a reactor with a bottom plug valve, 300 g toluene was added as a solvent. After heating to 90° C., 100 g poly(2,6-dimethylphenyl ether) in the reference synthetic example 1 and 10 g DOPO-containing dihydroxybiphenyl in the reference example 1 were dissolved to be a polyphenol compound. 100 g toluene solution of benzoyl peroxide (BPO) was added in 60 minutes and reacted at 90° C. for 180 minutes. Then, the reaction solution was sufficiently washed by NaHCO$_3$ aqueous solution, and the aqueous solution was removed. The polymer was separated from the organic phase through methanol precipitation, and the obtained wet cake was dissolved in toluene and re-precipitate in methanol. The separated solid was dried at 70° C. and under vacuum overnight to obtain phosphorous-containing dihydroxylated poly(arylene ether) (C1). The hydroxyl groups (—OH) of the obtained material containing phosphorous was derived through using phosphorous agent, and the content of the terminal hydroxyl group was determined by $^{31}$P NMR to be 2.09%. Weight average molecular weight (Mw) and number average molecular weight (Mn) were measured by gel permeation chromatography using standard polystyrene in THF to be 2531 and 3215 respectively, and the polydispersity index (Mw/Mn) was 1.27.

SYNTHETIC EXAMPLES 3-6

The synthesis was performed according to the raw material composition of Table 1 and the method of the synthetic example 2 to obtain a different phosphorous-containing dihydroxylated poly(arylene ether) (C2-C5).

TABLE 1

| | Synthetic example | | | | |
|---|---|---|---|---|---|
| Crude Material | 2<br>C1 | 3<br>C2 | 4<br>C3 | 5<br>C4 | 6<br>C5 |
| poly(2,6-dimethylphenyl ether) (B) (g) | 300 | 300 | 300 | 300 | 300 |
| DOPO-containing dihydroxyl biphenyl (A1) (g) | 10 | | | | |
| DOPO-containing bisphenol A (A2) (g) | | 10 | | | |
| DOPO-containing bisphenol F (A3) (g) | | | 10 | | |
| DOPO-containing bisphenol S (A4) (g) | | | | 10 | |
| DOPO-containing dicyclopentadiene phenol resin (A5) (g) | | | | | 10 |
| Benzoyl peroxide (BPO) (g) | 10 | 10 | 10 | 10 | 10 |
| Hydroxyl group content (%) | 2.09 | 2.04 | 1.97 | 1.98 | 1.95 |
| Number average molecular weight (Mw) | 2531 | 2331 | 2241 | 2150 | 2548 |
| Weight average molecular weight (Mn) | 3215 | 3007 | 2958 | 2688 | 3338 |
| polydispersity index (Mw/Mn) | 1.27 | 1.29 | 1.32 | 1.25 | 1.31 |

Synthetic examples 7-11 describe phosphorous-containing dihydroxylated poly(arylene ether) copolymerized by 2,6-dimethyl phenol in the presence of phosphorous-containing bisphenol compounds.

SYNTHETIC EXAMPLE 7

In a 5 L 5-necked round bottom flask equipped with a top stirrer, thermometer, and oxygen dip tube, 900 mL toluene, 20 g DOPO-containing dihydroxyl biphenyl (A1) in the reference example 1, 2.5 mL of 10% toluene solution of methyl trioctyl ammonium chloride, 60 mL of toluene solution of an amine (prepared by a composition of 5 mL di-t-butyl ethylene diamine, 100 mL dimethylbutyl amine, 25 mL dibutyl amine, and 300 mL toluene), 60 g 2,6-dimethylphenol in 50 wt % toluene solution, and 2.5 mL copper bromide solution were added. Under vigorous stirring, oxygen was passed through the solution at a flow rate of 0.4 ft$^3$/min. When the reaction temperature was kept at 90° C., 600 g 2,6-dimethyl phenol in 50% toluene solution was added through an additional funnel in 100 minutes. In that period, a water bath was used to keep the reaction temperature at about 25° C. After addition, the water bath was removed, and the reaction temperature was increased to 35° C. After 1 hour at that temperature, the oxygen flow was terminated, and the water bath was increased to 60° C. The temperature was kept for 60 minutes. 10 mL acetic acid was used to quench the reaction, and the temperature was cooled to room temperature. The polymer was separated from the organic phase through methanol precipitation, and the obtained wet cake was dissolved in toluene and re-precipitated in methanol. The separated solid was dried at 70° C. overnight to obtain phosphorous-containing dihydroxylated poly(arylene ethee) (D1). The hydroxyl groups (—OH) of the obtained material containing phosphorous was derived through using phosphorous agent, and the content of the terminal hydroxyl group was determined by $^{31}$P NMR to be 2.03%. Weight average molecular weight (Mw) and number average molecular weight (Mn) were measured by gel permeation chromatography using standard polystyrene in THF to be 2256 and 3722 respectively, and the polydispersity index (Mw/Mn) was 1.65.

SYNTHETIC EXAMPLES 8-11

The synthesis was performed according to the raw material composition of Table 2 and the method of the synthetic example 7 to obtain a different phosphorous-containing dihydroxylated poly(arylene ether) (D2-D5).

TABLE 2

| | Synthetic example | | | | |
|---|---|---|---|---|---|
| Crude Material | 7<br>D1 | 8<br>D2 | 9<br>D3 | 10<br>D4 | 11<br>D5 |
| poly(2,6-dimethylphenyl ether) (g) | 330 | 330 | 330 | 330 | 330 |
| DOPO-containing dihydroxyl biphenyl (A1) (g) | 20 | | | | |
| DOPO-containing bisphenol A (A2) (g) | | 20 | | | |
| DOPO-containing bisphenol F (A3) (g) | | | 20 | | |
| DOPO-containing bisphenol S (A4) (g) | | | | 20 | |
| DOPO-containing dicyclopentadiene phenol resin (A5) (g) | | | | | 20 |
| Hydroxyl group content (%) | 2.03 | 1.98 | 1.92 | 2.02 | 1.89 |
| Number average molecular weight (Mw) | 2256 | 2376 | 2178 | 2673 | 2793 |
| Weight average molecular weight (Mn) | 3722 | 4158 | 3680 | 4330 | 4945 |
| Polydispersity index (Mw/Mn) | 1.65 | 1.75 | 1.69 | 1.62 | 1.77 |

Synthetic examples 12-16 describe that methacrylic anhydride was used as a capping agent to cap the phosphorous-containing dihydroxylated poly(arylene ether) to prepare phosphorous-containing di-functionalized poly(arylene ether).

SYNTHETIC EXAMPLE 12

100 g phosphorous-containing di-hydroxylated poly(arylene ether) (C1) in synthetic example 2 was dissolved in 300 mL toluene, and 20 g 4-dimethylaminopyridine was added to the obtained solution. The mixture solution was heated to 90° C. under a stirring condition. When the reaction temperature was kept at 90° C. the 60 mL 50% toluene solution of methacrylic anhydride was added through an additional funnel in 30 minutes. The temperature was kept for 10 hours, and then cooled to room temperature. The polymer was separated from the organic phase through methanol precipitation, and the obtained wet cake was dissolved in toluene and re-precipitated in methanol. The separated solid was dried at 70° C. overnight to obtain phosphorous-containing di-functionalized poly(arylene ether) capped by methacrylic acid (E1). The content of hydroxyl group of the phosphorous-containing di-functionalized poly(arylene ether) capped by methacrylic acid was smaller than the detecting limit of 15 ppm.

SYNTHETIC EXAMPLE 13

100 g phosphorous-containing dihydroxylated poly(arylene ether) (C2) in synthetic example 3 was dissolved in 300 mL toluene, and 20 g 4-dimethylaminopyridine was added to the obtained solution. The mixture solution was heated to 90° C. under a stirring condition. When the reaction temperature was kept at 90° C., the 60 mL 50% toluene solution of methacrylic anhydride was added through an additional funnel in 30 minutes. The temperature was kept for 10 hours, and then cooled to room temperature. The polymer was separated from the organic phase through methanol precipitation, and the obtained wet cake was dissolved in toluene and re-precipitated in methanol. The separated solid was dried at 70° C. overnight to obtain phosphorous-containing di-functionalized poly(arylene ether) capped by methacrylic acid (E2). The content of hydroxyl group of the phosphorous-containing di-functionalized poly(arylene ether) capped by methacrylic acid was smaller than the detecting limit of 15 ppm.

SYNTHETIC EXAMPLE 14

100 g phosphorous-containing dihydroxylated poly(arylene ether) (C3) in synthetic example 4 was dissolved in 300 mL toluene, and 20 g 4-dimethylaminopyridine was added to the obtained solution. The mixture solution was heated to 90° C. under a stirring condition. When the reaction temperature was kept at 90° C., the 60 mL 50% toluene solution of methacrylic anhydride was added through an additional funnel in 30 minutes. The temperature was kept for 10 hours, and then cooled to room temperature. The polymer was separated from the organic phase through methanol precipitation, and the obtained wet cake was dissolved in toluene and re-precipitated in methanol. The separated solid was dried at 70° C. overnight to obtain phosphorous-containing di-functionalized poly(arylene ether) capped by methacrylic acid (E3). The content of hydroxyl group of the phosphorous-containing di-functionalized poly(arylene ether) capped by methacrylic acid was smaller than the detecting limit of 15 ppm.

SYNTHETIC EXAMPLE 15

100 g phosphorous-containing dihydroxylated poly(arylene ether) (C4) in synthetic example 5 was dissolved in 300 mL toluene, and 20 g 4-dimethylaminopyridine was added to the obtained solution. The mixture solution was heated to 90° C. under a stirring condition. When the reaction temperature was kept at 90° C., the 60 mL 50% toluene solution of methacrylic anhydride was added through an additional funnel in 30 minutes. The temperature was kept for 10 hours, and then cooled to room temperature. The polymer was separated from the organic phase through methanol precipitation, and the obtained wet cake was dissolved in toluene and re-precipitated in methanol. The separated solid was dried at 70° C. overnight to obtain phosphorous-containing di-functionalized poly(arylene ether) capped by methacrylic acid (E4). The content of hydroxyl group of the phosphorous-containing di-functionalized poly(arylene ether) capped by methacrylic acid was smaller than the detecting limit of 15 ppm.

SYNTHETIC EXAMPLE 16

100 g phosphorous-containing dihydroxylated poly(arylene ether) (C5) in synthetic example 6 was dissolved in 300 mL, toluene, and 20 g 4-dimethylaminopyridine was added to the obtained solution. The mixture solution was heated to 90° C. under a stirring condition. When the reaction temperature was kept at 90° C., the 60 mL 50% toluene solution of methacrylic anhydride was added through an additional funnel in 30 minutes. The temperature was kept for 10 hours, and then cooled to room temperature. The polymer was separated from the organic phase through methanol precipitation, and the obtained wet cake was dissolved in toluene and re-precipitated in methanol. The separated solid was dried at 70° C. overnight to obtain phosphorous-containing di-functionalized poly(arylene ether) capped by methacrylic acid (E5). The content of hydroxyl group of the phosphorous-containing di-functionalized poly(arylene ether) capped by methacrylic acid was smaller than the detecting limit of 15 ppm.

Synthetic examples 17-21 describe that vinylbenzyl chloride was used as a capping agent to cap the phosphorous-containing dihydroxylated poly(arylene ether) to prepare phosphorous-containing di-functionalized poly(arylene ether).

SYNTHETIC EXAMPLE 17

100 g phosphorous-containing di-hydroxylated poly(arylene ether) (C1) prepared in synthetic example 2 and 27 g vinylbenzyl chloride was dissolved in 300 mL N,N-dimethylacetamide. The mixture solution was heated to 50° C. under a stirring condition. When the reaction temperature was kept at 50° C., the 50 mL 20% methanol solution of sodium methoxide was added through an additional funnel in 30 minutes. The temperature was kept for 1 hour, and 10 mL 20% MeOH solution of sodium methoxide was dropwise added. The reaction mixture was heated to 70° C., and stirred for 1 hour at a kept temperature. 2.5 g 30% N,N-dimethylacetamide solution of phosphate was then added. 500 g toluene and 500 g water was added and stirrer. After standing, the pH of the separated water phase was 4.0. The generated salt was removed by filtering. After removing the salt, the acidic solution was dropwise added by 150 g 20% methanol solution of sodium methoxide. 300 g toluene and 300 g pure water were added and stirred. After standing, the pH of the separated water phase was 5.8. The salt obtained by adding alkaline material was removed, and the salt-free solution was dropwise added to 600 g water to precipitate polymer. The wet cake of the separated polymer was dissolved in toluene and re-precipitated in methanol. The separated solid was dried under vacuum at 70° C. overnight to obtain phosphorous-containing di-functionalized poly (arylene ether) capped by vinylbenzyl group (F1). The content of hydroxyl group of the phosphorous-containing di-functionalized poly(arylene ether) capped by vinylbenzyl group was smaller than the detecting limit of 15 ppm.

SYNTHETIC EXAMPLE 18

100 g phosphorous-containing di-hydroxylated poly (arylene ether) (C2) prepared in synthetic example 3 and 27 g vinylbenzyl chloride was dissolved in 300 mL N,N-dimethylacetamide. The mixture solution was heated to 50° C. under a stirring condition. When the reaction temperature was kept at 50° C., the 50 mL 20% methanol solution of sodium methoxide was added through an additional funnel in 30 minutes. The temperature was kept for 1 hour, and 10 mL 20% MeOH solution of sodium methoxide was dropwise added. The reaction mixture was heated to 70° C., and stirred for 1 hour at a kept temperature. 2.5 g 30% N,N-dimethylacetamide solution of phosphate was then added. 500 g toluene and 500 g water was added and stirrer. After standing, the pH of the separated water phase was 4.0. The generated salt was removed by filtering. After removing the salt, the acidic solution was dropwise added by 150 g 20% methanol solution of sodium methoxide. 300 g toluene and 300 g pure water were added and stirred. After standing, the pH of the separated water phase was 5.8. The salt obtained by adding alkaline material was removed, and the salt-free solution was dropwise added to 600 g water to precipitate polymer. The wet cake of the separated polymer was dissolved in toluene and re-precipitated in methanol. The separated solid was dried under vacuum at 70° C. overnight to obtain phosphorous-containing di-functionalized poly (arylene ether) capped by vinylbenzyl group (F2). The content of hydroxyl group of the phosphorous-containing di-functionalized poly(arylene ether) capped by vinylbenzyl group was smaller than the detecting limit of 15 ppm.

SYNTHETIC EXAMPLE 19

100 g phosphorous-containing di-hydroxylated poly (arylene ether) (C3) prepared in synthetic example 4 and 27 g vinylbenzyl chloride was dissolved in 300 mL N,N-dimethylacetamide. The mixture solution was heated to 50° C. under a stirring condition. When the reaction temperature was kept at 50° C., the 50 mL 20% methanol solution of sodium methoxide was added through an additional funnel in 30 minutes. The temperature was kept for 1 hour, and 10 mL 20% MeOH solution of sodium methoxide was dropwise added. The reaction mixture was heated to 70° C., and stirred for 1 hour at a kept temperature. 2.5 g 30% N,N-dimethylacetamide solution of phosphate was then added. 500 g toluene and 500 g water was added and stirrer. After standing, the pH of the separated water phase was 4.0. The generated salt was removed by filtering. After removing the salt, the acidic solution was dropwise added by 150 g 20% methanol solution of sodium methoxide. 300 g toluene and 300 g pure water were added and stirred. After standing, the pH of the separated water phase was 5.8. The salt obtained by adding alkaline material was removed, and the salt-free solution was dropwise added to 600 g water to precipitate polymer. The wet cake of the separated polymer was dissolved in toluene and re-precipitated in methanol. The separated solid was dried under vacuum at 70° C. overnight to obtain phosphorous-containing di-functionalized poly (arylene ether) capped by vinylbenzyl group (F3). The content of hydroxyl group of the phosphorous-containing di-functionalized poly(arylene ether) capped by vinylbenzyl group was smaller than the detecting limit of 15 ppm.

SYNTHETIC EXAMPLE 20

100 g phosphorous-containing di-hydroxylated poly (arylene ether) (C4) prepared in synthetic example 5 and 27 g vinylbenzyl chloride was dissolved in 300 mL N,N-dimethylacetamide. The mixture solution was heated to 50° C. under a stirring condition. When the reaction temperature was kept at 50° C., the 50 mL 20% methanol solution of sodium methoxide was added through an additional funnel in 30 minutes. The temperature was kept for 1 hour, and 10 mL 20% MeOH solution of sodium methoxide was dropwise added. The reaction mixture was heated to 70° C. and stirred for 1 hour at a kept temperature. 2.5 g 30% N,N-dimethylacetamide solution of phosphate was then added. 500 g toluene and 500 g water was added and stirrer. After standing, the pH of the separated water phase was 4.0. The generated salt was removed by filtering. After removing the salt, the acidic solution was dropwise added by 150 g 20% methanol solution of sodium methoxide. 300 g toluene and 300 g pure water were added and stirred. After standing, the pH of the separated water phase was 5.8. The salt obtained by adding alkaline material was removed, and the salt-free solution was dropwise added to 600 g water to precipitate polymer. The wet cake of the separated polymer was dissolved in toluene and re-precipitated in methanol. The separated solid was dried under vacuum at 70° C. overnight to obtain phosphorous-containing di-functionalized poly (arylene ether) capped by vinylbenzyl group (F4). The content of hydroxyl group of the phosphorous-containing di-functionalized poly(arylene ether) capped by vinylbenzyl group was smaller than the detecting limit of 15 ppm.

SYNTHETIC EXAMPLE 21

100 g phosphorous-containing di-hydroxylated poly (arylene ether) (C5) prepared in synthetic example 6 and 27 g vinylbenzyl chloride was dissolved in 300 mL N,N-dimethylacetamide. The mixture solution was heated to 50° C. under a stirring condition. When the reaction temperature was kept at 50° C., the 50 mL 20% methanol solution of sodium methoxide was added through an additional funnel in 30 minutes. The temperature was kept for 1 hour, and 10 mL 20% MeOH solution of sodium methoxide was dropwise added. The reaction mixture was heated to 70° C., and stirred for 1 hour at a kept temperature. 2.5 g 30% N,N-dimethylacetamide solution of phosphate was then added. 500 g toluene and 500 g water was added and stirrer. After standing, the pH of the separated water phase was 4.0. The generated salt was removed by filtering. After removing the salt, the acidic solution was dropwise added by 150 g 20% methanol solution of sodium methoxide 300 g toluene and 300 g pure water were added and stirred. After standing, the pH of the separated water phase was 5.8. The salt obtained by adding alkaline material was removed, and the salt-free solution was dropwise added to 600 g water to precipitate polymer. The wet cake of the separated polymer was dissolved in toluene and re-precipitated in methanol. The separated solid was dried under vacuum at 70° C. overnight to obtain phosphorous-containing di-functionalized poly (arylene ether) capped by vinylbenzyl group (F5). The content of hydroxyl group of the phosphorous-containing di-functionalized poly(arylene ether) capped by vinylbenzyl group was smaller than the detecting limit of 15 ppm.

APPLIED EXAMPLE 1

100 g phosphorous-containing di-functionalized poly (arylene ether) capped by methacrylic acid (E1) in synthetic example 12 was completely dissolved in 100 g toluene to obtain a solution of functionalized poly(arylene ether). 40 g styrene-butadiene copolymer as a crosslinking agent, 3.5 g dicumyl peroxide (DCP) as an initiator, 50 g silica as a filler, and 3 g 3-glycidyltrimethoxysilane were added and then stirred to dissolve them in toluene until a resin composition was formed.

Afterward, the uniform resin composition obtained above was infiltrate an E-fiberglass cloth and heated at 155° C. for 3-10 minutes to completely volatilize the solvent to obtain a prepreg. 8 prepregs were laminated, and two surfaces thereof were cladded by 35 μm copper foils. Thermocompression was performed under a temperature of 200° C. and a pressure of 3.0 MPa for 90 minutes to obtain a double-sided cooper clad laminate.

APPLIED EXAMPLE 2

80 g phosphorous-containing di-functionalized poly (arylene ether) capped by methacrylic acid (E1) in synthetic example 12 was dissolved in 80 g toluene to obtain a solution of functionalized poly(arylene ether) after dissolved completely. 60 g styrene-butadiene copolymer as a crosslinking agent, 3.5 g dicumyl peroxide (DCP) as an initiator, 50 g silica as a filler, and 3 g 3-glycidyitrimethoxysilane were added and then stirred to dissolve them in toluene until a resin composition was formed.

Afterward, the uniform resin composition obtained above was infiltrate an E-fiberglass cloth and heated at 155° C. for 3-10 minutes to completely volatilize the solvent to obtain a prepreg. 8 prepregs were laminated, and two surfaces thereof were cladded by 35 μm copper foils. Thermocompression was performed under a temperature of 200° C. and a pressure of 3.0 MPa for 90 minutes to obtain a double-sided cooper clad laminate.

APPLIED EXAMPLE 3

50 g phosphorous-containing di-functionalized poly (arylene ether) capped by methacrylic acid (E1) in synthetic example 12 was dissolved in 50 g toluene to obtain a solution of functionalized poly(arylene ether) after dissolved completely. 80 g maleic anhydride modified butadiene resin as a crosslinking agent, 3.5 g dicumyl peroxide (DCP) as an initiator, 50 g silica as a filler, and 3 g 3-glycidyltrimethoxysilane were added and then stirred to dissolve them in toluene until a resin composition was formed.

Afterward, the uniform resin composition obtained above was infiltrate an E-fiberglass cloth and heated at 155° C. for 3-10 minutes to completely volatilize the solvent to obtain a prepreg. 8 prepregs were laminated, and two surfaces thereof were cladded by 35 μm copper foils. Thermocompression was performed under a temperature of 200° C. and a pressure of 3.0 MPa for 90 minutes to obtain a double-sided cooper clad laminate.

APPLIED EXAMPLE 4

100 g phosphorous-containing di-functionalized poly (arylene ether) capped by vinylbenzyl group (F1) in synthetic example 17 was dissolved in 100 g toluene to obtain a solution of functionalized poly(arylene ether) after dissolved completely. 60 g styrene-butadiene copolymer as a crosslinking agent, 3.5 g dicumyl peroxide (DCP) as an initiator, 50 g silica as a filler, and 3 g 3-glycidyltrimethoxysilane were added and then stirred to dissolve them in toluene until a resin composition was formed.

Afterward, the uniform resin composition obtained above was infiltrate an E-fiberglass cloth and heated at 155° C. for 3-10 minutes to completely volatilize the solvent to obtain a prepreg. 8 prepregs ere laminated, and two surfaces thereof were cladded by 35 μm copper foils. Thermocompression was performed under a temperature of 200° C. and a pressure of 3.0 MPa for 90 minutes to obtain a double-sided cooper clad laminate.

APPLIED EXAMPLE 5

80 g phosphorous-containing di-functionalized poly (arylene ether) capped by vinylbenzyl group (F1) in synthetic example 17 was dissolved in 80 g toluene to obtain a solution of functionalized poly(arylene ether) after dissolved completely. 80 g styrene-butadiene copolymer as a crosslinking agent, 3.5 g dicumyl peroxide (DCP) as an initiator, 50 g silica as a filler, and 3 g 3-glycidyltrimethoxysilane were added and then stirred to dissolve them in toluene until a resin composition was formed.

Afterward, the uniform resin composition obtained above was infiltrate an E-fiberglass cloth and heated at 155° C. for 3-10 minutes to completely volatilize the solvent to obtain a prepreg. 8 prepregs were laminated, and two surfaces thereof were cladded by 35 μm copper foils. Thermocompression was performed under a temperature of 200° C. and a pressure of 3.0 MPa for 90 minutes to obtain a double-sided cooper clad laminate.

APPLIED EXAMPLE 6

100 g phosphorous-containing di-functionalized poly (arylene ether) capped by vinylbenzyl group (F1) in synthetic example 17 was dissolved in 80 g toluene to obtain a solution of functionalized poly(arylene ether) after dissolved completely. 60 g styrene-butadiene-divinylbenzene copolymer as a crosslinking agent, 3.5 g dicumyl peroxide (DCP) as an initiator, 50 g silica as a filler, and 3 g 3-glycidyltrimethoxysilane were added and then stirred to dissolve them in toluene until a resin composition was formed.

Afterward, the uniform resin composition obtained above was infiltrate an E-fiberglass cloth and heated at 155° C. for 3-10 minutes to completely volatilize the solvent to obtain a prepreg. 8 prepregs were laminated, and two surfaces thereof were cladded by 35 μm copper foils. Thermocompression was performed under a temperature of 200° C. and a pressure of 3.0 MPa for 90 minutes to obtain a double-sided cooper clad laminate.

APPLIED COMPARISON EXAMPLE 1

80 g phosphorous-containing di-functionalized poly (arylene ether) capped by vinylbenzyl group (F1) in synthetic example 17 was dissolved in 80 g toluene to obtain a solution of functionalized poly(arylene ether) after dissolved completely. 30 g triallyl isocyanurate (DVB) as a crosslinking agent, 3.5 g dicumyl peroxide (DCP) as an initiator, 50 g silica as a filler, and 3 g 3-glycidyltrimethoxysilane were added and then stirred to dissolve them in toluene until a resin composition was formed.

Afterward, the uniform resin composition obtained above was infiltrate an E-fiberglass cloth and heated at 155° C. for 3-10 minutes to completely volatilize the solvent to obtain a prepreg. 8 prepregs were laminated, and two surfaces thereof were cladded by 35 μm copper foils. Thermocompression was performed under a temperature of 200° C. and a pressure of 3.0 MPa for 90 minutes to obtain a double-sided cooper clad laminate.

APPLIED COMPARISON EXAMPLE 2

80 g phosphorous-containing di-functionalized poly (arylene ether) capped by vinylbenzyl group (F1) in synthetic example 17 was dissolved in 80 g toluene to obtain a solution of functionalized poly(arylene ether) after dissolved completely. 35 g divnyl benzene (DVB) as a crosslinking agent, 3.5 g dicumyl peroxide (DCP) as an initiator, 50 g silica as a filler, and 3 g 3-glycidyltrimethoxysilane were added and then stirred to dissolve them in toluene until a resin composition was formed.

Afterward, the uniform resin composition obtained above was infiltrate an E-fiberglass cloth and heated at 155° C. for 3-10 minutes to completely volatilize the solvent to obtain a prepreg. 8 prepregs were laminated, and two surfaces thereof were cladded by 35 μm copper foils. Thermocompression was performed under a temperature of 200° C. and a pressure of 3.0 MPa for 90 minutes to obtain a double-sided cooper clad laminate.

(3) The mixed glue stood to observe whether the glue was a uniform and transparent solution. After standing for 24 hours, the resin composition was observed whether delamination phenomenon was existed. The test method of the volatility was described below. The prepared prepregs were baked at 155° C. for 10 minutes. The weight loss of the prepregs was measured. The volatility of the resin composition is great if the weight loss was over 2%. The fluidity of the resin was measured by the known measuring method in the art.

Physical Properties Analysis

According to the physical properties in Table 3, it can be known that among applied example 1-5 the resins using olefin resins containing styrene segment and functionalized poly(arylene ether) resin have good compatibility, and the prepared laminated sheets have good heat resistance and dielectric properties. The comparison examples 1-2 use low molecular compound having multi-functional groups, triallyl isocyanurate (TAIC) and divinyl benzene (DVB), to be the crosslinking agent. Although the cross-linking effect is very good, but triallyl isocyanurate (TAIC) and divinyl benzene (DVB) have very strong volatility.

As described above, comparing with the general copper clad laminate, the copper clad laminate prepared from the polyphenylene oxide resin composition of this invention has better dielectric properties, i.e. lower dielectric constant and dielectric loss tangent, and has very good heat resistance and moisture resistance. The copper clad laminates of this invention are suitable to be used in high-frequency and high-speed printed circuit board field, and used in the processing of multilayer printed circuit board.

Although this invention has been practiced according to preferred embodiments, but the persons skilled in the art will understand that the elements may be changed and replaced

TABLE 3

| Material and properties | Applied example | | | | | Applied comparison example | |
|---|---|---|---|---|---|---|---|
| | 1 | 2 | 3 | 4 | 5 | 1 | 2 |
| Compatibility | good | good | good | good | good | good | good |
| Volatility | no | no | no | no | no | yes | yes |
| Fluidity | good | good | good | good | good | good | good |
| Peel strength (n/mm) | 1.30 | 1.42 | 1.28 | 145 | 1.41 | 0.81 | 0.55 |
| Tg (DMA) (° C.) | 231 | 225 | 226 | 240 | 235 | 220 | 200 |
| Dielectric constant (10 GHz) | 3.68 | 3.65 | 3.25 | 3.71 | 3.31 | 3.49 | 3.61 |
| Dielectric loss tangent (10 GHz) | 0.0048 | 0.0042 | 0.0049 | 0.0038 | 0.0036 | 0.0057 | 0.0048 |
| Dip resistance weldability 288° C. (sec) | >120 | >120 | >120 | >120 | >120 | >120 | >120 |
| Prepreg stickiness | not sticky | not sticky | not sticky | not sticky | not sticky | not sticky | not sticky |
| Bending strength (MPa) | 330 | 340 | 320 | 380 | 365 | 267 | 287 |
| T288 (min) | >15 | >15 | >15 | >15 | >15 | >15 | >15 |

The test method of the above properties are described below:

(1) Glass transition temperature (Tg) was tested according to the DMA testing method in PC-TM-6502.4.24.

(2) Dielectric constant (Dk) and dielectric loss tangent (Df) were measured according to SPQR method.

by the equivalents thereof without departure the scope of this invention. Moreover, many improvements may be made to make a certain condition or material to be suitably used in the technical content taught by this invention without departure the scope of this invention. Therefore, this invention was not limited by particular embodiments of the invention disclosed in the best way contemplated, and comprises all of the embodiments in the appended claims.

Although the embodiments of the present invention have been disclosed as above, it is not intended to limit the present invention. Any person skilled in the art can make various modifications and variations without departing from the spirit and scope of the present invention. Therefore, the scope of the invention should be as defined by the appended claims.

What is claimed is:

1. A preparation method of a phosphorous-containing functionalized poly(arylene ether) represented by chemical structure (I):

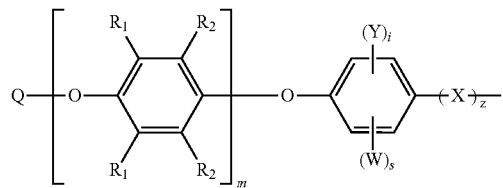

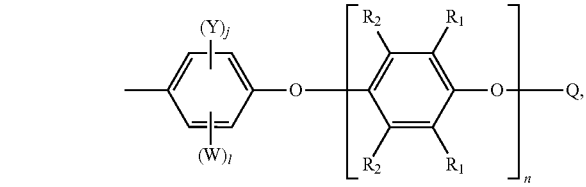

wherein each $R_1$ is independently selected from a C1-C10 alkyl group, a C2-C10 alkenyl group, a C2-C10 alkynyl group, a C1-C10 hydroxyalkyl group, a phenyl group, and a C1-C10 alkoxyl group;

each $R_2$ is independently selected from H, a C1-C10 alkyl group, a C2-C10 alkenyl group, C2-C10 alkynyl group, a C1-C10 hydroxyalkyl group, a phenyl group and a C1-C10 alkoxyl group;

i and j are integers of 0-2 respectively, and sum of i and j is not equal to 0;

m and n are integers of 0-50, and sum of m and n is not smaller than 3;

z is 1;

W is independently selected from H and C1-C5 alkyl group;

s and t are integers of 1-4;

Q is

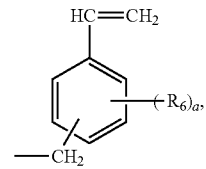

wherein $R_6$ is a C1-C10 alkyl group or a C6-C18 aromatic group, and a is an integer of 0-4;

Y is

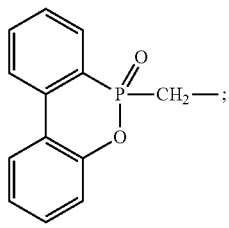

and

X is

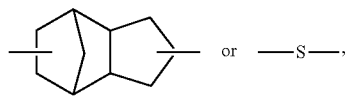

wherein the preparation method comprises:
mixing a bisphenol compound and DOPO (9,10-Dihydro-9-oxa-10-phosphaphenanthrene-10-oxide) to perform condensation reaction to obtain a phosphorus-containing bisphenol compound;
oxidatively polymerizing a phenol to form a corresponding poly(arylene ether) under a suitable condition and a catalyst;
reacting the poly(arylene ether) and the phosphorus-containing bisphenol compound to form a phosphorus-containing poly(arylene ether) having two terminal hydroxyl groups; and
reacting a capping agent with the phosphorus-containing poly(arylene ether) having two terminal hydroxyl groups to form the phosphorous-containing functionalized poly(arylene ether), wherein the capping agent comprises halogenated hydrocarbons and carboxylic anhydrides.

2. A preparation method of a phosphorous-containing functionalized poly(arylene ether) represented by chemical structure (I):

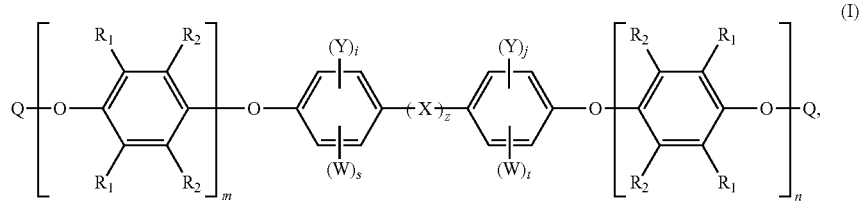

wherein each $R_1$ is independently selected from a C1-C10 alkyl group, a C2-C10 alkenyl group, a C2-C10 alkynyl group, a C1-C10 hydroxyalkyl group, a phenyl group, and a C1-C10 alkoxyl group;

each $R_2$ is independently selected from H, a C1-C10 alkyl group, a C2-C10 alkenyl group, C2-C10 alkynyl group, a C1-C10 hydroxyalkyl group, a phenyl group and a C1-C10 alkoxyl group;

i and j are integers of 0-2 respectively, and sum of i and j is not equal to 0;

m and n are integers of 0-50, and sum of m and n is not smaller than 3;

z is 1;

W is independently selected from H and C1-C5 alkyl group;

s and t are integers of 1-4;

Q is

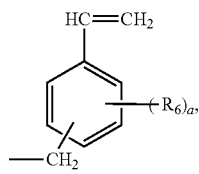

wherein $R_6$ is a C1-C10 alkyl group or a C6-C18 aromatic group, and a is an integer of 0-4;

Y is

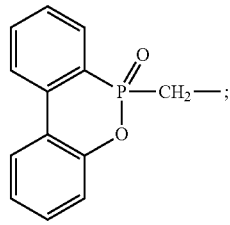 [SMILES: CCP1(=O)Oc2ccccc2-c2ccccc21]

and

X is

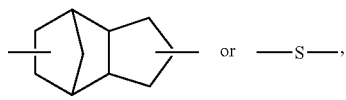

wherein the preparation method comprises:
    oxidatively copolymerizing a phenol and a phosphorous-containing bisphenol to form a phosphorus-containing poly(arylene ether) having two terminal hydroxyl groups; and
    reacting a capping agent with the phosphorus-containing poly(arylene ether) having two terminal hydroxyl groups to form the phosphorous-containing functionalized poly(arylene ether), wherein the capping agent comprises halogenated hydrocarbons and carboxylic anhydrides.

3. The preparation method of claim 2, wherein the phenol having a structure below:

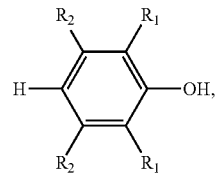

wherein each $R_1$ is independently selected from a primary or secondary C1-C10 alkyl group, a C2-C10 alkenyl group, C2-C10 alkynyl group, a C1-C10 hydroxyalkyl group, a phenyl group, a C1-C10 alkoxyl group; and each $R_2$ is independently selected from H, a primary or secondary C1-C10 alkyl group, a C2-C10 alkenyl group, C2-C10 alkynyl group, a C1-C10 hydroxyalkyl group, a phenyl group, a C1-C10 alkoxyl group.

4. The preparation method of claim 2, wherein the phenol is selected from 2,6-dimethylphenol, 2,3,6-trimethylphenol, and a mixture thereof.

5. The preparation method of claim 2, wherein the phosphorous-containing bisphenol having a chemical structure below:

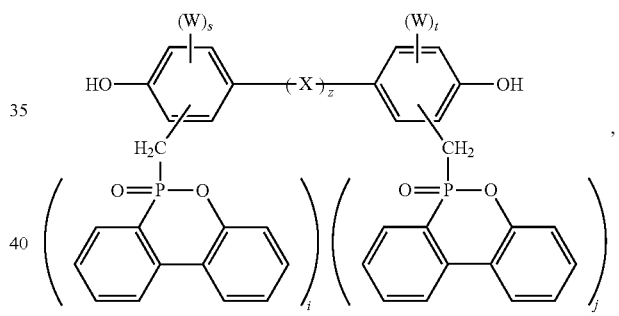

wherein each W is independently selected from H and C1-C5 alkyl group; s and t are integers of 1-4; i and j are integers of 0-2 respectively, and sum of i and j is not equal to 0; X is selected from

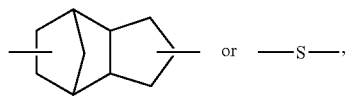

wherein $R_7$ and $R_8$ are independently selected from H, a C1-C10 alkyl group, and a C6-C18 aromatic group.

* * * * *